(12) United States Patent
Toi

(10) Patent No.: US 10,177,903 B1
(45) Date of Patent: Jan. 8, 2019

(54) SEMICONDUCTOR INTEGRATED CIRCUIT AND RECEIVER

(71) Applicant: TOSHIBA MEMORY CORPORATION, Minato-ku, Tokyo (JP)

(72) Inventor: Takashi Toi, Kawasaki Kanagawa (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/906,779

(22) Filed: Feb. 27, 2018

(30) Foreign Application Priority Data

Aug. 28, 2017 (JP) .................................. 2017-163721

(51) Int. Cl.
| H04L 7/033 | (2006.01) |
| H03K 5/24 | (2006.01) |
| H03K 3/021 | (2006.01) |
| H04L 25/03 | (2006.01) |
| H04L 25/49 | (2006.01) |
| H03K 3/03 | (2006.01) |

(52) U.S. Cl.
CPC ........... H04L 7/0331 (2013.01); H03K 3/021 (2013.01); H03K 5/24 (2013.01); H04L 7/0334 (2013.01); H04L 25/03878 (2013.01); H04L 25/4917 (2013.01); *H03K 3/0315* (2013.01)

(58) Field of Classification Search
USPC .................................................. 375/230, 376
See application file for complete search history.

(56) References Cited

U.S. PATENT DOCUMENTS

| 5,341,405 | A | * | 8/1994 | Mallard, Jr. | ........... | H03D 3/242 |
| | | | | | | 331/11 |
| 5,760,653 | A | * | 6/1998 | Soda | ....................... | H03L 7/091 |
| | | | | | | 327/156 |
| 9,281,934 | B2 | * | 3/2016 | Song | ..................... | H04L 7/0016 |
| 2005/0012539 | A1 | * | 1/2005 | Huang | ................... | H03K 5/135 |
| | | | | | | 327/407 |
| 2006/0104399 | A1 | * | 5/2006 | Byun | .................... | H03D 13/004 |
| | | | | | | 375/376 |
| 2014/0306721 | A1 | * | 10/2014 | Fesshaie | ................ | G01B 21/16 |
| | | | | | | 324/649 |
| 2016/0234007 | A1 | * | 8/2016 | Lee | ........................... | H03L 7/23 |

FOREIGN PATENT DOCUMENTS

| JP | S60-127470 A | 7/1985 |
| JP | S60-258776 A | 12/1985 |
| JP | 2009-239441 A | 10/2009 |

* cited by examiner

*Primary Examiner* — Eva Puente
(74) *Attorney, Agent, or Firm* — Foley & Lardner LLP

(57) ABSTRACT

A semiconductor integrated circuit includes a clock recovery circuit that receive a multi-level pulse-amplitude modulated signal and to recover a clock signal. The clock recovery circuit includes a generation circuit and an oscillator. The generation circuit includes a plurality of comparators and pulse generators and a pulse summing circuit. The plurality of comparators and pulse generators compare the multi-level pulse-amplitude modulated signal with a plurality of threshold values to generate a plurality of pulses according to a plurality of comparison results. The pulse summing circuit generates a synthetic pulse based on the generated plurality of pulses. The oscillator oscillates in synchronization with the synthetic pulse to generate the clock signal.

20 Claims, 11 Drawing Sheets

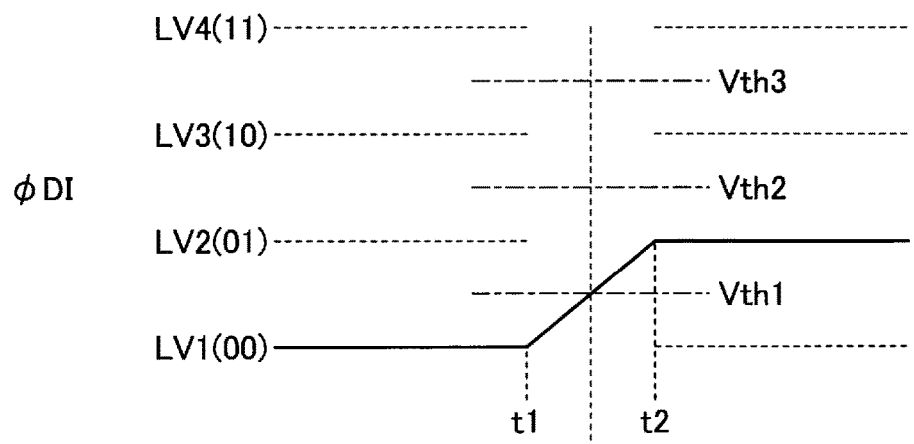
FIG. 4A
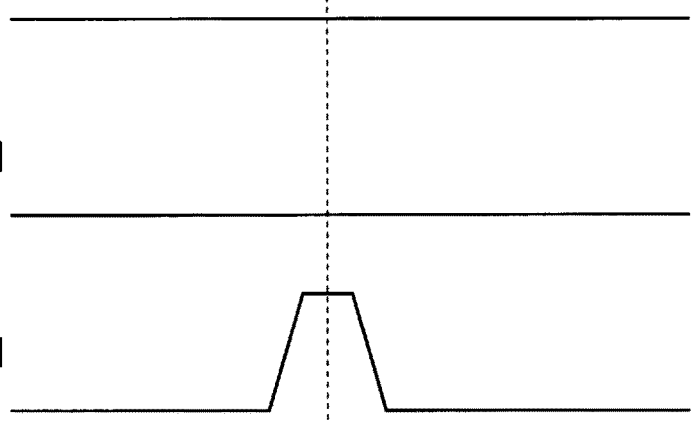
FIG. 4B  φP[3]
FIG. 4C  φP[2]
FIG. 4D  φP[1]
FIG. 4E  φSP

FIG. 9B φP[3] 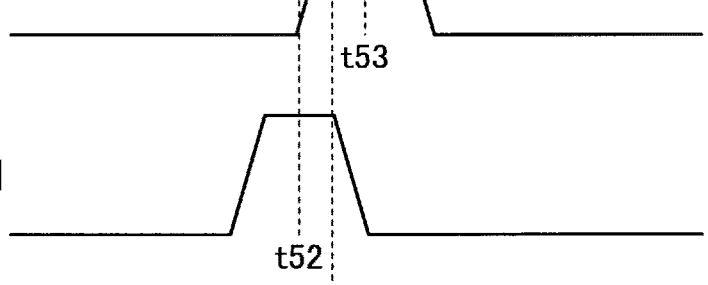
FIG. 9C φP[2] 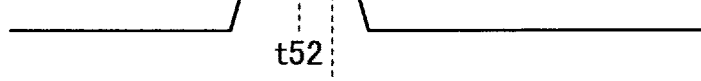
FIG. 9D φP[1] 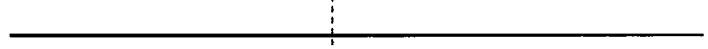
FIG. 9E φSP 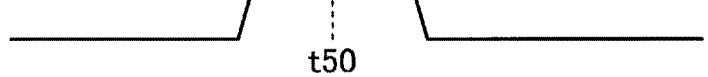

SEMICONDUCTOR INTEGRATED CIRCUIT AND RECEIVER

CROSS-REFERENCE TO RELATED APPLICATION

This application claims the benefit of and priority to Japanese Patent Application No. 2017-163721, filed Aug. 28, 2017, the entire contents of which are incorporated herein by reference.

FIELD

Embodiments described herein relate generally to a semiconductor integrated circuit and a receiver.

BACKGROUND

In a semiconductor integrated circuit including a clock recovery circuit, a clock signal can be reproduced or recovered from a modulation signal and data can be recovered by using the recovered clock signal. It can be desirable to accurately recover the clock signal.

DESCRIPTION OF THE DRAWINGS

FIG. 4A, FIG. 4B, FIG. 4C, FIG. 4D, and FIG. 4E are waveform diagrams illustrating an operation of a semiconductor integrated circuit according to one or more embodiments.

FIG. 5A, FIG. 5B, FIG. 5C, FIG. 5D, and FIG. 5E are waveform diagrams illustrating an operation of a semiconductor integrated circuit according to one or more embodiments.

FIG. 6A, FIG. 6B, FIG. 6C, FIG. 6D, and FIG. 6E, and FIG. 6E are waveform diagrams illustrating an operation of a semiconductor integrated circuit according to one or more embodiments.

FIG. 7A, FIG. 7B, FIG. 7C, FIG. 7D, and FIG. 7E are waveform diagrams illustrating an operation of a semiconductor integrated circuit according to one or more embodiments.

FIG. 8A, FIG. 8B, FIG. 8C, FIG. 8D, and FIG. 8E are waveform diagrams illustrating an operation of a semiconductor integrated circuit according to one or more embodiments.

FIG. 9A, FIG. 9B, FIG. 9C, FIG. 9D, and FIG. 9E are waveform diagrams illustrating an operation of a semiconductor integrated circuit according to one or more embodiments.

DETAILED DESCRIPTION

An example embodiment provides for a semiconductor integrated circuit and a receiver configured to accurately recover a clock signal.

In general, according to one or more embodiments, a semiconductor integrated circuit implemented as a clock and data recovery circuit (CDR) includes a clock recovery circuit configured to receive a multi-level pulse-amplitude modulated signal and recover a clock signal. The clock recovery circuit includes a generation circuit and an oscillator. The generation circuit includes a plurality of comparators and pulse generators and a pulse summing circuit. The plurality of comparators and pulse generators is configured to compare the multi-level pulse-amplitude modulated signal with a plurality of threshold values to generate a plurality of pulses based on a plurality of comparison results. The pulse summing circuit is configured to generate a synthetic pulse based on the generated plurality of pulses. The oscillator is configured to oscillate in synchronization with the synthetic pulse to generate the clock signal. The oscillator may be an injection-locked oscillator.

Hereinafter, a semiconductor integrated circuit and a receiver according to an embodiment will be described in detail with reference to the accompanying drawings. It should be noted that the present disclosure is not limited to these embodiments.

An embodiment of a semiconductor integrated circuit according to an aspect of the present disclosure is, for example, a clock and data recovery (CDR) circuit 1. Upon receiving a multi-level pulse-amplitude modulated signal φDI, the CDR circuit 1 recovers a clock signal φCK using the multi-level pulse-amplitude modulated signal φDI and recovers data φDO by using the recovered clock signal φCK. The CDR circuit 1 outputs the clock signal φCK and data φDO. At this time, it can be useful to recover the clock signal φCK accurately.

Figure 1:
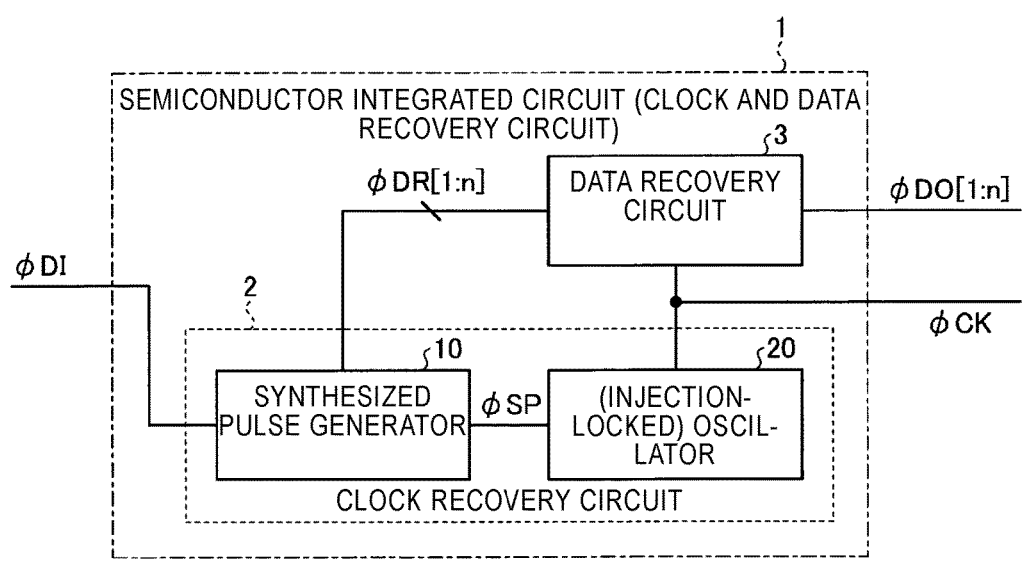
FIG. 1 is a block diagram illustrating a configuration of a semiconductor integrated circuit according to one or more embodiments.

Specifically, as illustrated in FIG. 1, the CDR circuit 1 includes a clock recovery circuit 2 and a data recovery circuit 3. FIG. 1 is a block diagram illustrating the configuration of the CDR circuit 1. The clock recovery circuit 2 receives the multi-level pulse-amplitude modulated signal φDI and recovers the clock signal φCK. The clock recovery circuit 2 supplies the clock signal φCK to the data recovery circuit 3 and can also output the clock signal φCK to another circuit, such as an internal circuit (see, e.g., FIG. 11) of the CDR circuit 1. The data recovery circuit 3 recovers the data φDO from a signal corresponding to the multi-level pulse-amplitude modulated signal φDI in synchronization with the clock signal φCK recovered by the clock recovery circuit 2. The data recovery circuit 3 outputs the data φDO to the internal circuit of the CDR circuit 1.

The clock recovery circuit 2 can include an oscillator 20. The oscillator 20 may be an injection-locked oscillator, or any other appropriate oscillator. Upon receiving a pulse indicating an edge timing, the oscillator 20 performs an oscillation operation synchronized with a waveform of the pulse (e.g. with the entire waveform of the pulse) by an injection locking effect. In some embodiments, the oscillator 20 may perform the oscillation operation synchronized with a peak of the pulse.

Here, in the clock recovery circuit 2, it is considered that an edge detection circuit is provided in a front stage of the oscillator 20, an edge of a waveform of the multi-level pulse-amplitude modulated signal φDI is detected by the edge detection circuit, and a pulse indicating the detected edge timing is generated in the edge detection circuit and is supplied to the oscillator 20. In this case, since there is a possibility that the edge timing may not be properly detected, there is a possibility that the oscillator 20 cannot oscillate properly.

For example, when the multi-level pulse-amplitude modulated signal ϕDI is a four-value pulse amplitude modulation (PAM4: Pulse Amplitude Modulation 4), the multi-level pulse-amplitude modulated signal ϕDI may be at one of four possible signal levels LV1 to LV4 (see, e.g., FIG. 4A). The signal level (first signal level) LV1 represents a bit pattern "00". The signal level (third signal level) LV2 represents a bit pattern "01". The signal level (fourth signal level) LV3 represents a bit pattern "10". The signal level (second signal level) LV4 represents a bit pattern "11".

When the edge detection circuit compares the multi-level pulse-amplitude modulated signal ϕDI with a threshold value to detect the edge of the waveform, the edge timing may not be detected (e.g., four out of 12 kinds of data transitions may not be detected) or a detected edge timing can deviate and vary from an appropriate timing.

For example, when a threshold value used by the edge detection circuit is Vth2 (e.g. a voltage threshold between LV2 and LV3), an edge timing in the transition from the signal level LV1 to the signal level LV2 may not be detected (see, e.g., FIG. 4A). An edge timing in a transition from the signal level LV1 to the signal level LV3 is likely to be detected as a timing t12 (corresponding to a time at which the threshold voltage Vth2 is reached) shifted to the later side from the proper timing t10 (see, e.g., FIG. 5A). An edge timing in a transition from the signal level LV2 to the signal level LV1 may not be detected (see, e.g., FIG. 7A). An edge timing in a transition from the signal level LV2 to the signal level LV4 is likely to be detected as a timing t52 (corresponding to a time at which the threshold voltage Vth2 is reached) shifted to the earlier side from the proper timing t50 (see, e.g., FIG. 9A).

Unless the edge timing is properly detected and the pulse waveform supplied to the oscillator 20 is proper, there is a possibility that the oscillator 20 may not properly oscillate. For example, a band of the CDR 1 tends to decrease due to undetectable data transition and a jitter tolerance of the CDR 1 tends to deteriorate due to the variation of the detected edge timing.

Therefore, in the present embodiment, the clock recovery circuit 2 generates a plurality of pulses based on a plurality of comparison results obtained by comparing the multi-level pulse-amplitude modulated signal with a plurality of threshold values and supplies a pulse obtained by synthesizing these generated pulses to the oscillator 20, thereby achieving an improved oscillation operation of the oscillator 20. The generated plurality of pulses can be synthesized or otherwise combined according to a function (e.g. by aggregating, adding, or integrating them).

Specifically, as illustrated in FIG. 1, the clock recovery circuit 2 includes a synthesized pulse generator 10 in addition to the oscillator 20. The synthesized pulse generator 10 compares the multi-level pulse-amplitude modulated signal ϕDI with a plurality of threshold values 200C to generate a plurality of comparison results ϕDR[1] to ϕDR[n]. The synthesized pulse generator 10 supplies the plurality of comparison results ϕDR[1] to ϕDR[n] to the data recovery circuit 3, generates a plurality of pulses corresponding to the plurality of comparison results ϕDR[1] to ϕDR[n], and generates a synthetic pulse ϕSP based on the generated plurality of pulses. The synthesized pulse generator 10 supplies the synthetic pulse ϕSP to the oscillator 20. The oscillator 20 is an injection-locked oscillator and oscillates in synchronization with the synthesis pulse ϕSP to generate a clock signal ϕCK. The oscillator 20 supplies the clock signal ϕCK to the data recovery circuit 3 and also supplies it to the internal circuit (see, e.g., FIG. 11).

The data recovery circuit 3 recovers data ϕDO[1:n] based on the plurality of comparison results ϕDR[1] to ϕDR[n] in synchronization with the clock signal ϕCK recovered by the clock recovery circuit 2. The data recovery circuit 3 outputs the data ϕDO[1:n] to the internal circuit.

Figure 2:
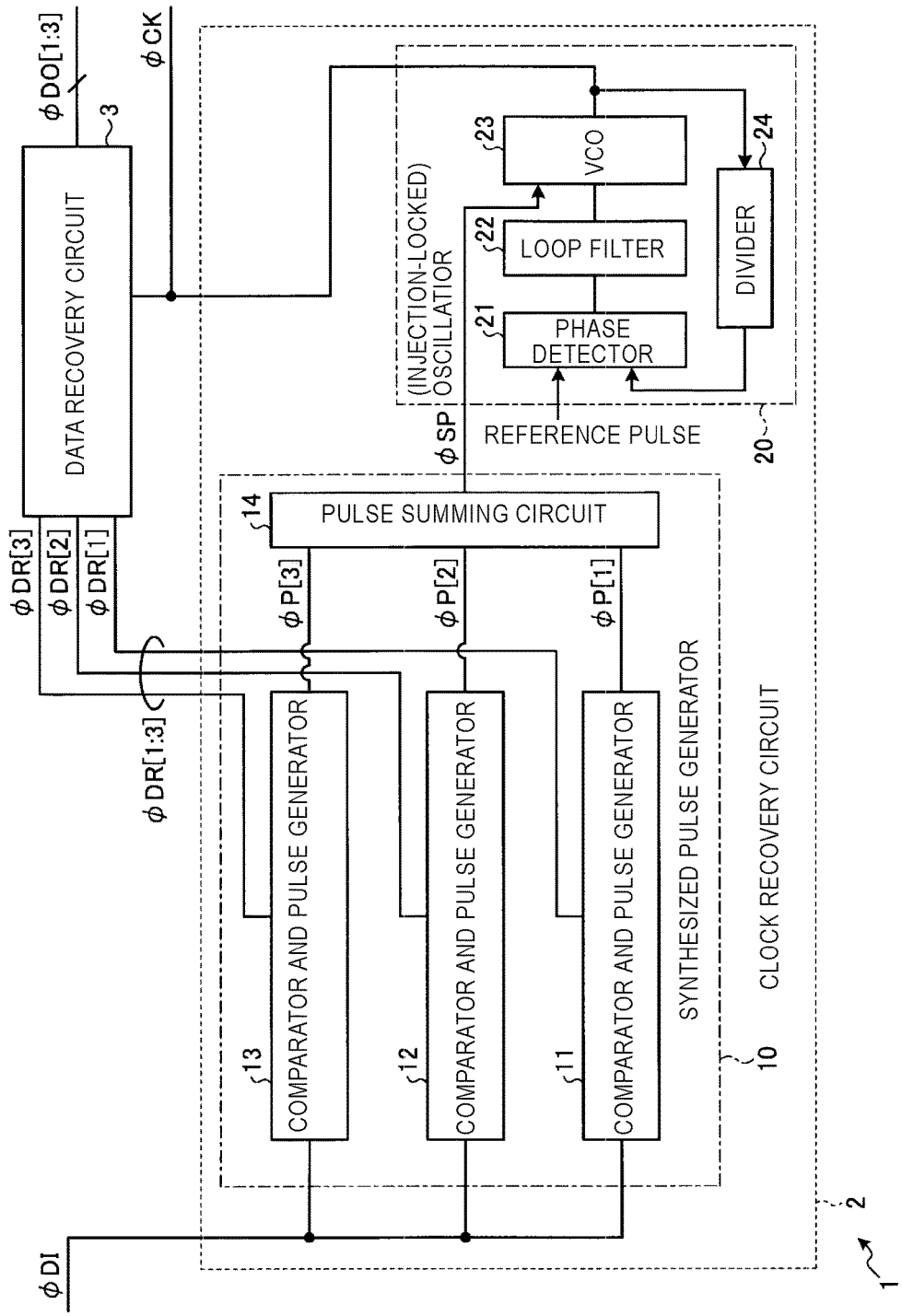
FIG. 2 is a block diagram illustrating a configuration of a semiconductor integrated circuit according to one or more embodiments.

As shown in FIG. 2, the synthesized pulse generator 10 can include n comparators and pulse generators (in the depicted example, n=3 and the synthesized pulse generator 10 includes comparators and pulse generators 11, 12, and 13), and a pulse summing circuit 14. When the multi-level pulse-amplitude modulated signal ϕDI is a (n+1) valued pulse pulse-amplitude modulated (PAMn+1) signal (e.g. the modulation signal ϕDI can have one of n+1 possible signal levels), the synthesized pulse generator 10 can implement the n comparators and pulse generators and the pulse summing circuit. The n comparators and pulse generators generate n comparison results ϕDR[1:n] (ϕDR[1] to ϕDR[n]) by comparing the multi-level pulse-amplitude modulated signal ϕDI with n threshold values, and supply them to the data recovery circuit 3. The n comparators and pulse generators generate n pulses ϕP[1] to ϕP[n] based on the n comparison results ϕDR[1] to ϕDR[n] and supply them to the pulse summing circuit. The pulse summing circuit generates a synthetic pulse ϕSP based on the n pulses ϕP[1] to ϕP[n] and supplies it to the oscillator 20.

Figure 3:
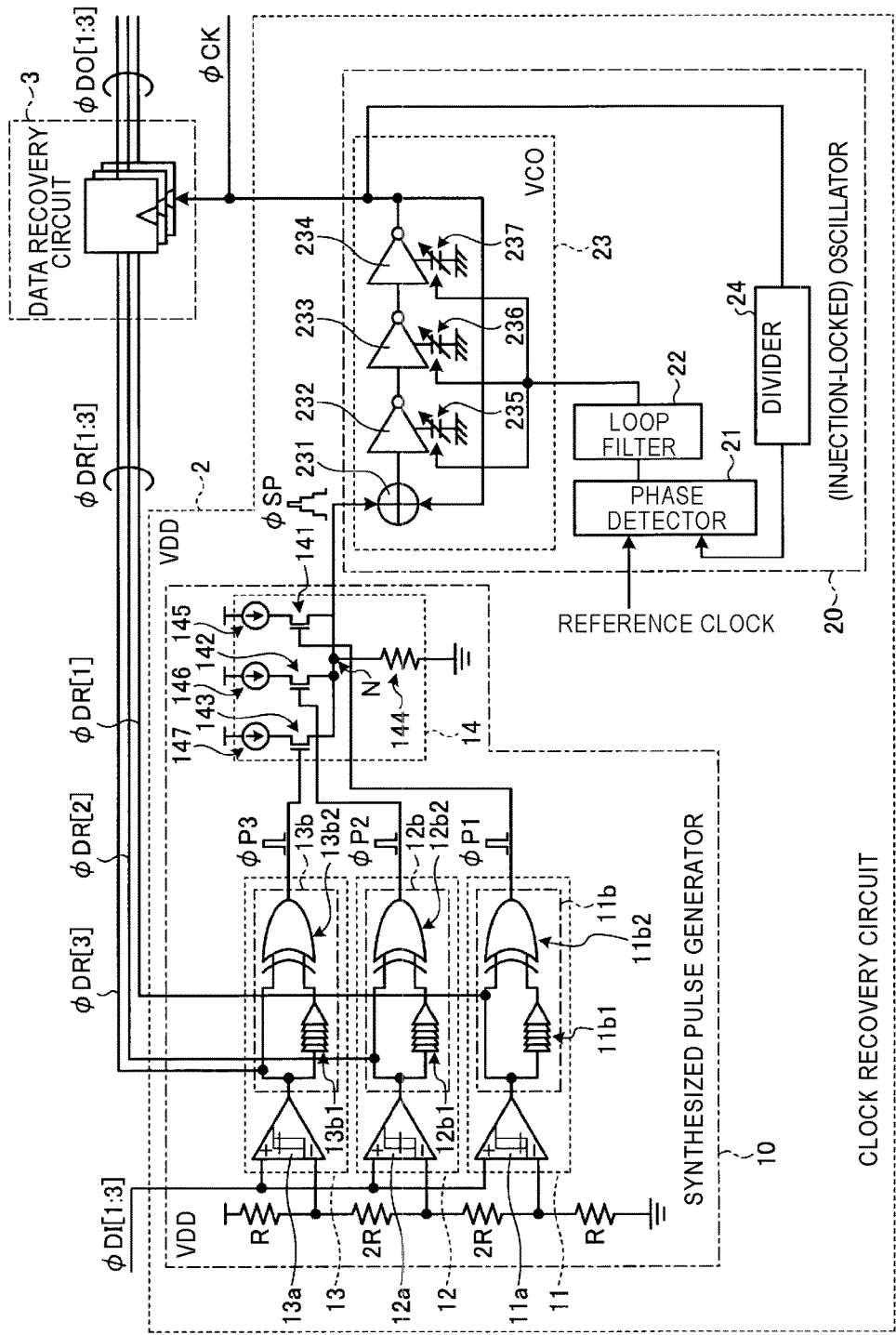
FIG. 3 is a circuit diagram illustrating a detailed configuration of a semiconductor integrated circuit according to one or more embodiments.

For example, when the multi-level pulse-amplitude modulated signal ϕDI is a PAM4 (n=3) signal, the CDR circuit 1 is configured as illustrated in FIGS. 2 and 3. FIG. 2 is a block diagram illustrating the configuration of the CDR circuit 1. FIG. 3 is a circuit diagram illustrating the configuration of the CDR circuit 1.

As shown in FIG. 2, the synthesized pulse generator includes the comparator and pulse generator (first comparator and pulse generator) 11, the comparator and pulse generator (second comparator and pulse generator) 12, the comparator and pulse generator (third comparator and pulse generator) 13, and the pulse summing circuit 14.

The comparator and pulse generator 11 compares the level of the multi-level pulse-amplitude modulated signal ϕDI with a threshold level (first threshold level) Vth1 to generate a pulse (first pulse) ϕP[1]. The threshold level Vth1 has a level between the signal level (first signal level) LV1 and a threshold level (second threshold level) Vth2, and between the signal level (first signal level) LV1 and the signal level (third signal level) LV2 (see, e.g., FIG. 4A).

For example, as shown in FIG. 3, the comparator and pulse generator 11 includes a comparator (first comparator) 11a and a pulse generator (first pulse generator) lib. The comparator 11a receives the multi-level pulse-amplitude modulated signal ϕDI at its inverting input terminal and receives a reference voltage Vref1 (e.g., a reference voltage Vref1 generated by the voltage divider shown in FIG. 3 that includes a power supply potential VDD and fours resistors having respective values of R, 2R, 2R, and R, where Vref1=R/(R+2R+2R+R)×VDD) at its non-inverting input terminal. The comparator 11a compares the multi-level pulse-amplitude modulated signal ϕDI and the reference voltage Vref1 and supplies a comparison result ϕDR[1] to the pulse generator 11b and the data recovery circuit 3. The pulse generator 11b includes a delay circuit 11b1 and an OR circuit 11b2, performs an OR operation of a signal of the comparison result ϕDR[1] and a signal obtained by delaying the comparison result φDR[1] by the delay circuit 11b1, and supplies a result of the OR operation to the pulse summing circuit 14 as the pulse φP[1].

The comparator and pulse generator 12 compares the level of the multi-level pulse-amplitude modulated signal φDI with the threshold level (second threshold level) Vth2 to generate a pulse (second pulse) φP[2]. The threshold level Vth2 has a level between the signal level (first signal level) LV1 and the signal level (second signal level) LV4, and between the signal level (third signal level) LV2 and the signal level (fourth signal level) LV3.

For example, the comparator and pulse generator 12 includes a comparator (second comparator) 12a and a pulse generator (second pulse generator) 12b. The comparator 12a receives the multi-level pulse-amplitude modulated signal φDI at its inverting input terminal and receives a reference voltage Vref2 (e.g., a reference voltage Vref2 generated by the depicted voltage divider, where Vref2=(R+2R)/(R+2R+2R+R)×VDD) at its non-inverting input terminal. The comparator 12a compares the multi-level pulse-amplitude modulated signal φDI and the reference voltage Vref2 and supplies a comparison result φDR[2] to the pulse generator 12b and the data recovery circuit 3. The pulse generator 12b includes a delay circuit 12b1 and an OR circuit 12b2, performs an OR operation of a signal of the comparison result φDR[2] and a signal obtained by delaying the comparison result φDR[2] by the delay circuit 12b1, and supplies a result of the OR operation to the pulse summing circuit 14 as the pulse φP[2].

The comparator and pulse generator 13 compares the level of the multi-level pulse-amplitude modulated signal φDI with a threshold level (third threshold level) Vth3 to generate a pulse (third pulse) φP[3]. The threshold level Vth3 has a level between the threshold level (second threshold level) Vth2 and the signal level (second signal level) LV4, and between the signal level (fourth signal level) LV3 and the signal level (second signal level) LV4.

For example, the comparator and pulse generator 13 includes a comparator (third comparator) 13a and a pulse generator (third pulse generator) 13b. The comparator 13a receives the multi-level pulse-amplitude modulated signal φDI at its inverting input terminal and receives a reference voltage Vref3 (e.g., a reference voltage Vref3 generated by the depicted voltage divider, where Vref3=(R+2R+2R)/(R+2R+2R+R)×VDD) at its non-inverting input terminal. The comparator 13a compares the multi-level pulse-amplitude modulated signal φDI and the reference voltage Vref3 and supplies a comparison result φDR[3] to the pulse generator 13b and the data recovery circuit 3. The pulse generator 13b includes a delay circuit 13b1 and an OR circuit 13b2, performs an OR operation of a signal of the comparison result φDR[3] and a signal obtained by delaying the comparison result φDR[3] by the delay circuit 13b1, and supplies a result of the OR operation to the pulse summing circuit 14 as the pulse φP[3].

The pulse summing circuit 14 generates a synthetic pulse φSP based on three pulses φP[1] to φP[3] according to a function. For example, the pulse summing circuit 14 aggregates the three pulses φP[1] to φP[3] to generate the synthetic pulse φSP. The pulse summing circuit 14 supplies the synthetic pulse φSP to the oscillator 20.

For example, as shown in FIG. 3, the pulse summing circuit 14 includes transistors 141 to 143, a resistance element 144, and current sources 145 to 147. The resistance element 144 is electrically disposed between a ground potential and a node N. A series connection of the transistor 141 and the current source 145, a series connection of the transistor 142 and the current source 146, and a series connection of the transistor 143 and the current source 147 are connected in parallel to the node N, and are electrically disposed between the node N and the power supply potential VDD. As a result, a voltage obtained by aggregating the voltages of the three pulses φP[1] to φP[3] may appear at the node N, and the synthetic pulse φSP obtained by aggregating the three pulses φP[1] to φP[3] together may be output from the node N to the oscillator 20.

The oscillator 20 includes a phase detector 21, a loop filter 22, a voltage controlled oscillator (VCO) 23, and a divider 24.

The phase detector 21 receives a reference clock signal, receives an internal clock signal (which can be generated as described below) from the divider 24, compares the phases of the reference clock signal and the internal clock signal, and supplies a phase error signal corresponding to a result of the comparison to the loop filter 22. The loop filter 22 generates a control signal for controlling the oscillation frequency of the VCO 23 based on the phase error signal, and supplies the control signal to the VCO 23. The VCO 23 receives the control signal from the loop filter 22 and receives the synthetic pulse φSP from the synthesized pulse generator 10. The VCO 23 performs an oscillating operation at an oscillation frequency corresponding to (or based on) the control signal so as to be synchronized with the peak timing of the synthetic pulse φSP by an injection locking effect.

For example, the VCO 23 includes an aggregator 231, inverters 232 to 234, and variable capacitance elements 235 to 237. An output of the inverter 234 (which can be a last component of an electrical path that includes the inverters 232 to 234) is connected to the aggregator 231, and the aggregator 231 and the inverters 232 to 234 constitute a ring oscillator. When capacitance values of the variable capacitance elements 235 to 237 are changed by the control signal from the loop filter 22, the drive capability of the inverters 232 to 234 and the oscillation frequency of the ring oscillator may be controlled. In addition, since the synthetic pulse φSP is supplied from the synthesized pulse generator 10 to the aggregator 231, the ring oscillator performs an oscillating operation substantially in synchronization with the peak timing of the synthetic pulse φSP by the injection locking effect.

The VCO 23 outputs a pulse generated by the oscillating operation, as the clock signal φCK, to a data recovery circuit 3 and an internal circuit of, for example, a receiver (see, e.g., FIG. 11), and also supplies the pulse to the divider 24. The divider 24 divides the frequency of the clock signal φCK to generate the internal clock signal and transmits the generated internal clock signal to the phase detector 21.

Next, the operation of generating the synthetic pulse φSP in the CDR circuit 1 will be described with reference to FIGS. 4A to 4E through FIGS. 9A to 9E which are waveform diagrams illustrating one or more embodiments of operation of the CDR circuit 1. FIGS. 4A to 4E to FIGS. 9A to 9E illustrate the operation of the CDR circuit 1 when the multi-level pulse-amplitude modulated signal φDI is a PAM4 (n=3) signal.

FIGS. 4A to 4E illustrate a an embodiment in which a multi-level pulse-amplitude modulated signal φDI rises from the signal level LV1 to the signal level LV2. As illustrated in FIG. 4A, the multi-level pulse-amplitude modulated signal φDI rises from the signal level LV1 towards the signal level LV2 and exceeds a threshold level Vth1 at a timing to. Accordingly, as illustrated in FIG. 4D, a pulse φP[1] (e.g. generated by the pulse generator 11) has a waveform having a peak in the vicinity of the timing t0. At this time, as illustrated in FIGS. 4C and 4B, the pulses φP[2] and φP[3] (e.g. respectively generated by the pulse generators 12 and 13) have a flat waveform. As a result, as illustrated in FIG. 4E, for example, a synthetic pulse φSP obtained by aggregating the three pulses φP[1] to φP[3] has a waveform having a peak in the vicinity of the timing t0.

The timing t0 is substantially at a midpoint between a start timing t1 at which the multi-level pulse-amplitude modulated signal φDI begins to rise from the signal level LV1 to the signal level LV2 and a completion timing t2 (e.g. at which the multi-level pulse-amplitude modulated signal φDI achieves the signal level LV2).

Figure 5A:
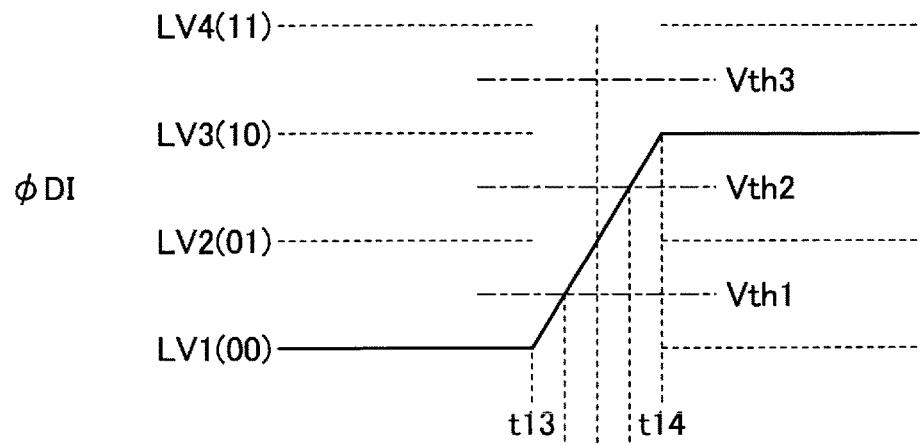
Figure 5A:
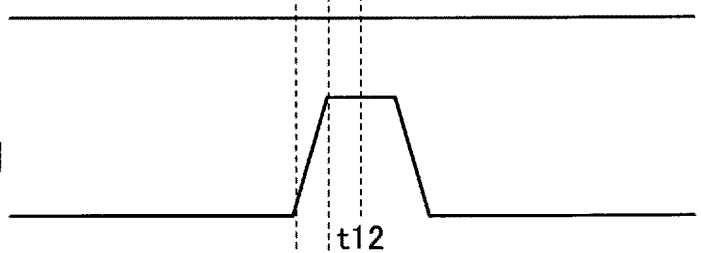
Figure 5A:
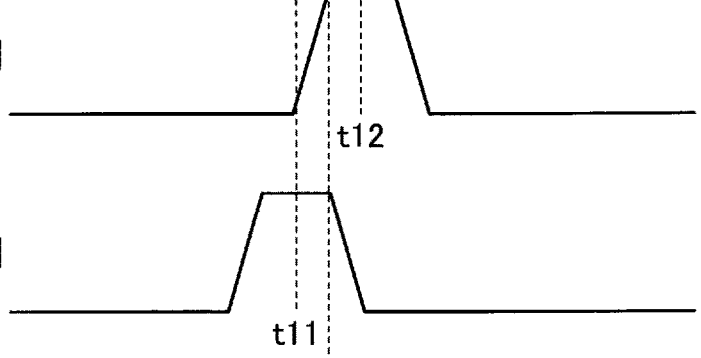
Figure 5A:
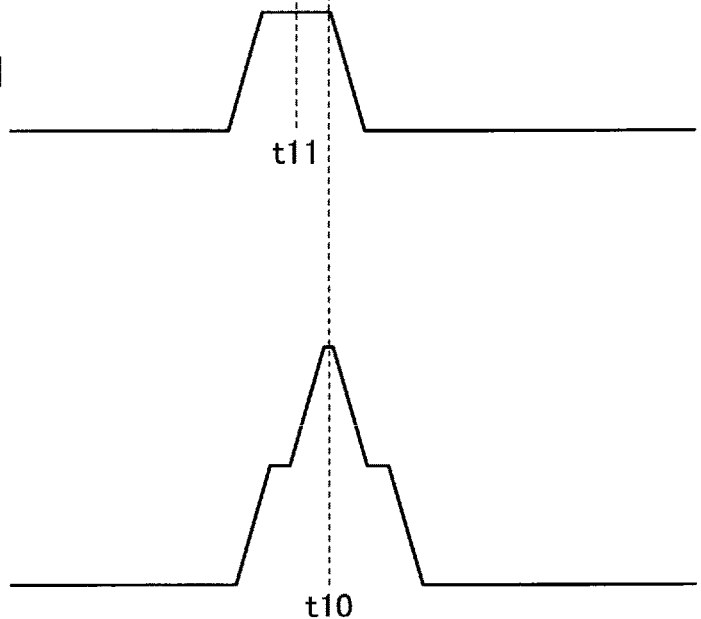

FIGS. 5A to 5E illustrate an embodiment in which the multi-level pulse-amplitude modulated signal φDI rises from the signal level LV1 to a signal level LV3. As illustrated in FIG. 5A, the multi-level pulse-amplitude modulated signal φDI rises from the signal level LV1 towards the signal level LV2 and exceeds the threshold level Vth1 at a timing t11. Accordingly, as illustrated in FIG. 5D, the pulse φP[1] has a waveform having a peak in the vicinity of the timing t11. In addition, the multi-level pulse-amplitude modulated signal φDI rises towards the signal level LV3 and exceeds a threshold level Vth2 at a timing t12. Accordingly, as illustrated in FIG. 5C, the pulse φP[2] has a waveform having a peak in the vicinity of the timing t12. At this time, as illustrated in FIG. 5B, the pulse φP[3] has a flat waveform. As a result, as illustrated in FIG. 5E, for example, the synthetic pulse φSP obtained by aggregating three pulses φP[1] to φP[3] has a waveform having a peak in the vicinity of the timing t10 (e.g. approximately at a mid-point between the timing t11 and the timing t12).

The timing t10 is substantially at a midpoint between a start timing t13 at which the multi-level pulse-amplitude modulated signal φDI begins to rise from the signal level LV1 to the signal level LV3 and a completion timing t14 (e.g. at which the multi-level pulse-amplitude modulated signal φDI achieves the signal level LV3).

Figure 6A:
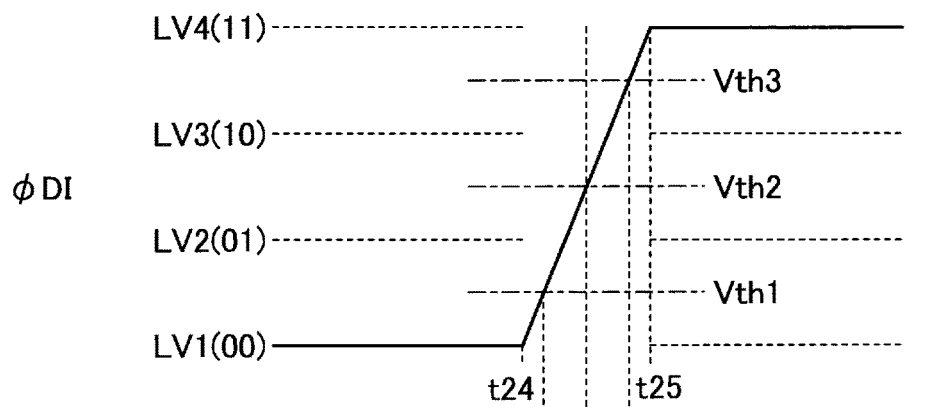

FIGS. 6A to 6E illustrate an embodiment in which the multi-level pulse-amplitude modulated signal φDI rises from the signal level LV1 to a signal level LV4. As illustrated in FIG. 6A, the multi-level pulse-amplitude modulated signal φDI rises from the signal level LV1 towards the signal level LV2 and exceeds the threshold level Vth1 at a timing t21. Accordingly, as illustrated in FIG. 6D, the pulse φP[1] has a waveform having a peak in the vicinity of the timing t21. In addition, the multi-level pulse-amplitude modulated signal φDI rises towards the signal level LV3 and exceeds the threshold level Vth2 at a timing t20. Accordingly, as illustrated in FIG. 6C, the pulse φP[2] has a waveform having a peak in the vicinity of the timing t20. In addition, the multi-level pulse-amplitude modulated signal φDI rises towards the signal level LV4 and exceeds a threshold level Vth3 at a timing t23. Accordingly, as illustrated in FIG. 6B, the pulse φP[3] has a waveform having a peak in the vicinity of the timing t23. As a result, as illustrated in FIG. 6E, for example, the synthetic pulse φSP obtained by aggregating three pulses φP[1] to φP[3] has a waveform having a peak in the vicinity of the timing t20.

The timing t20 is substantially at a midpoint between a start timing t24 at which the multi-level pulse-amplitude modulated signal φDI begins to rise from the signal level LV1 to the signal level LV4 and a completion timing t25 (e.g. at which the multi-level pulse-amplitude modulated signal φDI achieves the signal level LV4).

Figure 7A:
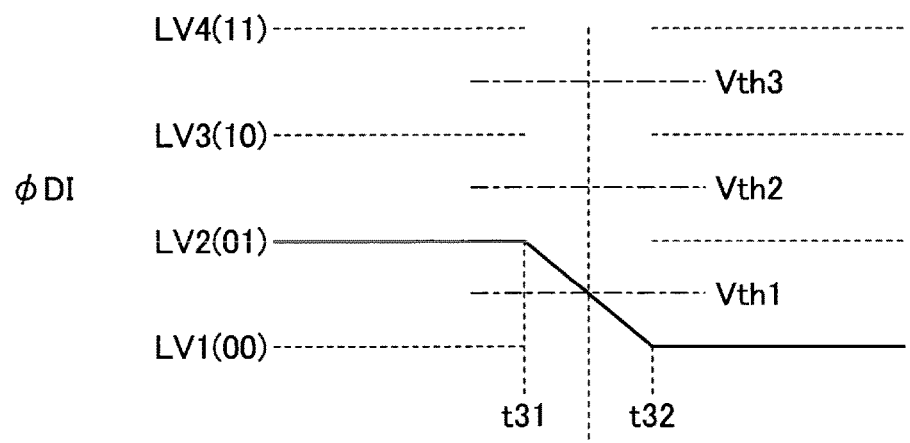
Figure 7A:
Figure 7A:
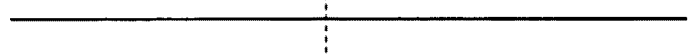
Figure 7A:
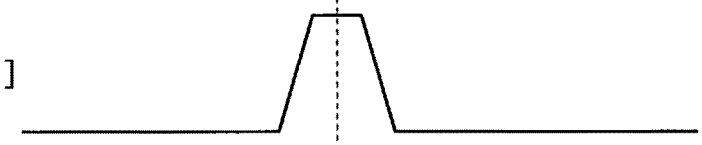
Figure 7A:
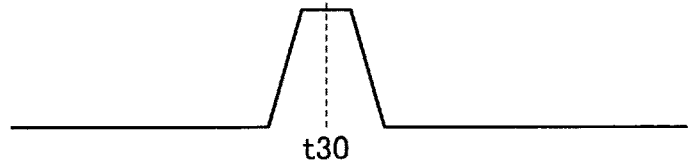

FIGS. 7A to 7E illustrate an embodiment in which the multi-level pulse-amplitude modulated signal φDI falls from the signal level LV2 to the signal level LV1. As illustrated in FIG. 7A, the multi-level pulse-amplitude modulated signal φDI falls from the signal level LV2 towards the signal level LV1 and is lower than the threshold level Vth1 at a timing t30. Accordingly, as illustrated in FIG. 7D, the pulse φP[1] has a waveform having a peak in the vicinity of the timing t30. At this time, as illustrated in FIGS. 7C and 7B, the pulses φP[2] and φP[3] have a flat waveform. As a result, as illustrated in FIG. 7E, for example, the synthetic pulse φSP obtained by aggregating three pulses φP[1] to φP[3] has a waveform having a peak in the vicinity of the timing t30.

The timing t30 is substantially at a midpoint between a start timing t31 at which the multi-level pulse-amplitude modulated signal φDI begins to fall from the signal level LV2 to the signal level LV1 and a completion timing t32 (e.g. at which the multi-level pulse-amplitude modulated signal φDI achieves the signal level LV1).

Figure 8A:
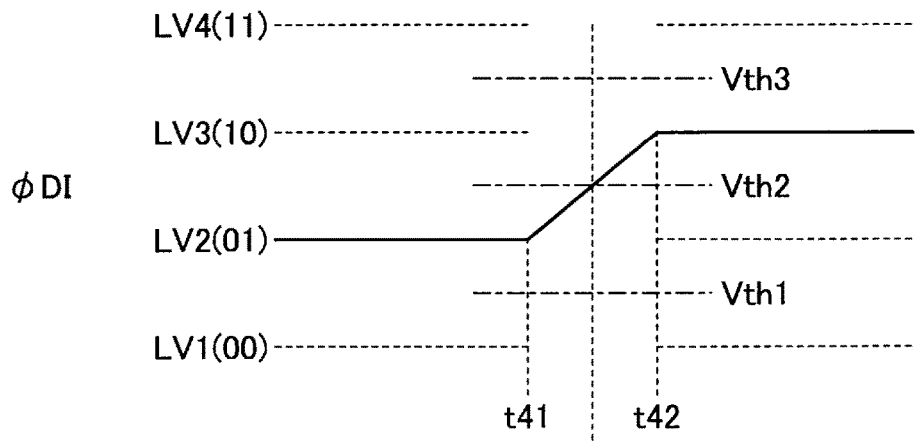
Figure 8A:
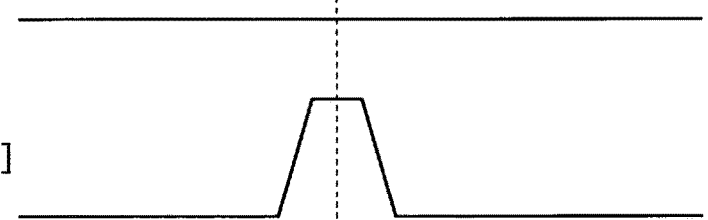
Figure 8A:
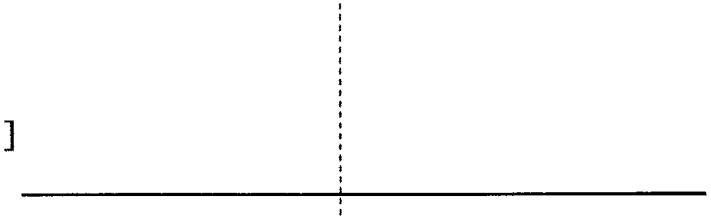
Figure 8A:
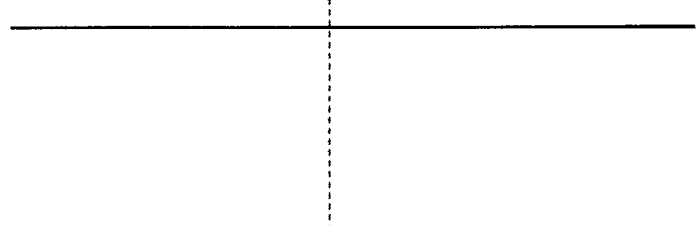
Figure 8A:
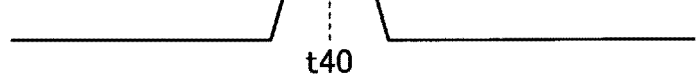

FIGS. 8A to 8E illustrate an embodiment in which the multi-level pulse-amplitude modulated signal φDI rises from the signal level LV2 to the signal level LV3. As illustrated in FIG. 8A, the multi-level pulse-amplitude modulated signal φDI rises from the signal level LV2 towards the signal level LV3 and exceeds the threshold level Vth2 at a timing t40. Accordingly, as illustrated in FIG. 8C, the pulse φP[2] has a waveform having a peak in the vicinity of the timing t40. At this time, as illustrated in FIGS. 8D and 8B, the pulses φP[1] and φP[3] have a flat waveform. As a result, as illustrated in FIG. 8E, for example, the synthetic pulse φSP obtained by aggregating three pulses φP[1] to φP[3] has a waveform having a peak in the vicinity of the timing t40.

The timing t40 is substantially at a midpoint between a start timing t41 at which the multi-level pulse-amplitude modulated signal φDI begins to rise from the signal level LV2 towards the signal level LV3 and a completion timing t42 (e.g. at which the multi-level pulse-amplitude modulated signal φDI achieves the signal level LV3).

Figure 9A:
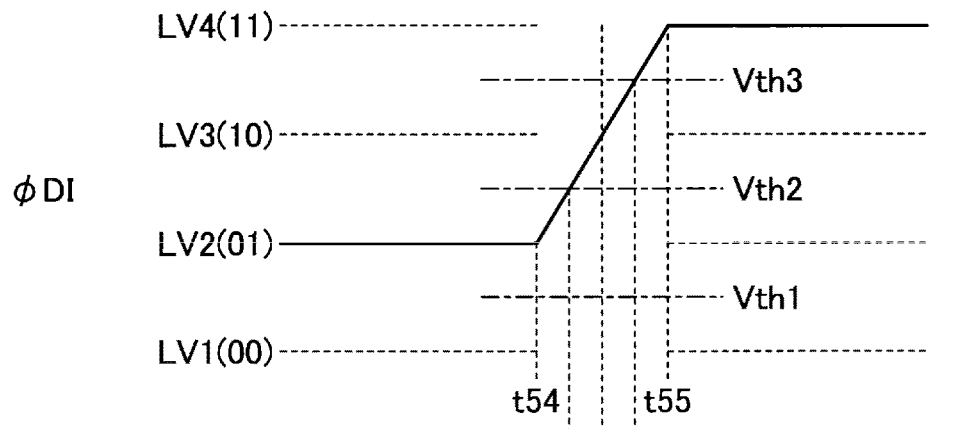

FIGS. 9A to 9E illustrate an embodiment in which the multi-level pulse-amplitude modulated signal φDI rises from the signal level LV2 to the signal level LV4. As illustrated in FIG. 9A, the multi-level pulse-amplitude modulated signal φDI rises from the signal level LV2 towards the signal level LV3 and exceeds the threshold level Vth2 at a timing t52. Accordingly, as illustrated in FIG. 9C, the pulse φP[2] has a waveform having a peak in the vicinity of the timing t52. In addition, the multi-level pulse-amplitude modulated signal φDI rises towards the signal level LV4 and exceeds the threshold level Vth3 at a timing t53. Accordingly, as illustrated in FIG. 9B, the pulse φP[3] has a waveform having a peak in the vicinity of the timing t53. At this time, as illustrated in FIG. 9D, the pulse φP[1] has a flat waveform. As a result, as illustrated in FIG. 9E, for example, the synthetic pulse φSP obtained by aggregating three pulses φP[1] to φP[3] has a waveform having a peak in the vicinity of a timing t50.

The timing t50 is substantially at a midpoint between a start timing t54 at which the multi-level pulse-amplitude modulated signal φDI begins to rise from the signal level LV2 to the signal level LV4 and a completion timing t55 (e.g. at which the multi-level pulse-amplitude modulated signal φDI achieves the signal level LV4).

Figure 10:
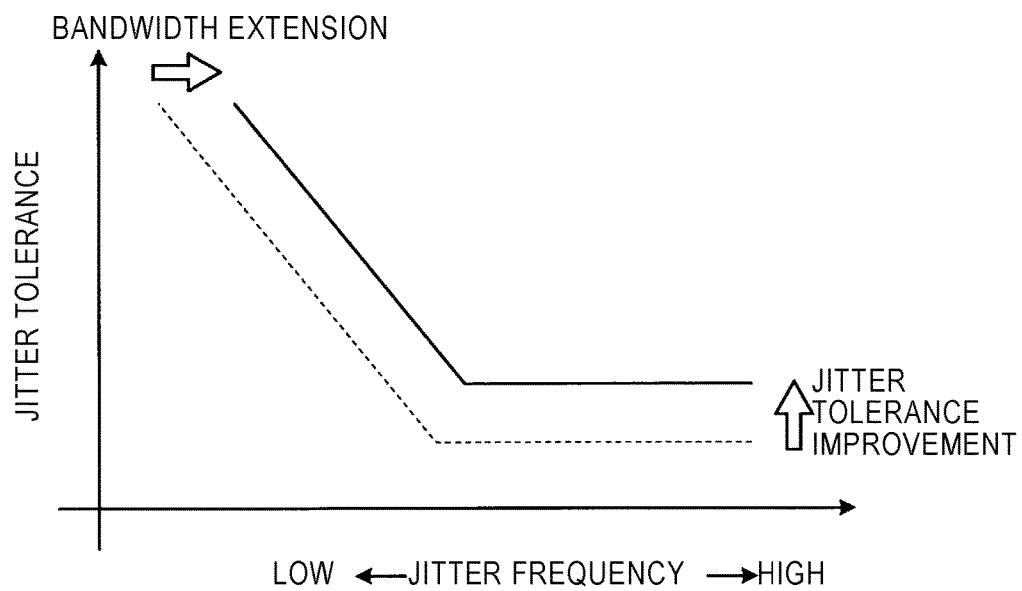
FIG. 10 is a graph showing a relationship between a jitter frequency and a jitter tolerance according to one or more embodiments.

As illustrated in FIGS. 4A to 4E to FIGS. 9A to 9E, the synthetic pulse φSP obtained by aggregating the three pulses φP[1] to φP[3] may have a waveform having a peak at a desired timing irrespective of data transition (e.g. voltage transition of the multi-level pulse-amplitude modulated signal φDI). In addition, 12 data transitions may be detected, corresponding to 12 combinations of starting voltage level and ending voltage level. By providing for detection of a plurality of data transitions (e.g. all possible data transitions, or 12 data transitions in the above-described one or more embodiments), a bandwidth may be expanded as illustrated in FIG. 10 and as described below. In addition, since variations in detected edge timings may be suppressed, a jitter tolerance may be improved as illustrated in FIG. 10 and as described below.

FIG. 10 is a graph illustrating a relationship (e.g. a characteristic curve) between a jitter frequency and a jitter tolerance. The characteristic curve in a case where the oscillator 20 oscillates in synchronization with a pulse obtained by comparing the multi-level pulse-amplitude modulated signal ϕDI with one threshold value to detect a waveform edge (that is, in a comparative case) is indicated by a broken line, and a characteristic curve corresponding to one or more embodiments described herein is indicated by a solid line. For example, with respect to a bandwidth, the characteristic curve of one or more embodiments described herein indicated by the solid line may be extended by about 1.5 times that of the characteristic curve indicated by the broken line. With respect to a jitter tolerance, the characteristic curve of one or more embodiments described herein indicated by the solid line may have a reduced jitter by about 70% to about 90% as compared with the characteristic curve indicated by the broken line, which corresponds to an improved jitter tolerance.

As described above, in one or more embodiments, the clock recovery circuit 2 is configured to generate a plurality of pulses based on a plurality of comparison results obtained by comparing a multi-level pulse-amplitude modulated signal with a plurality of threshold values, and supply a pulse obtained by synthesizing the generated plurality of pulses to the oscillator 20. Thus, the oscillation operation of the oscillator 20 may be improved.

Figure 11:
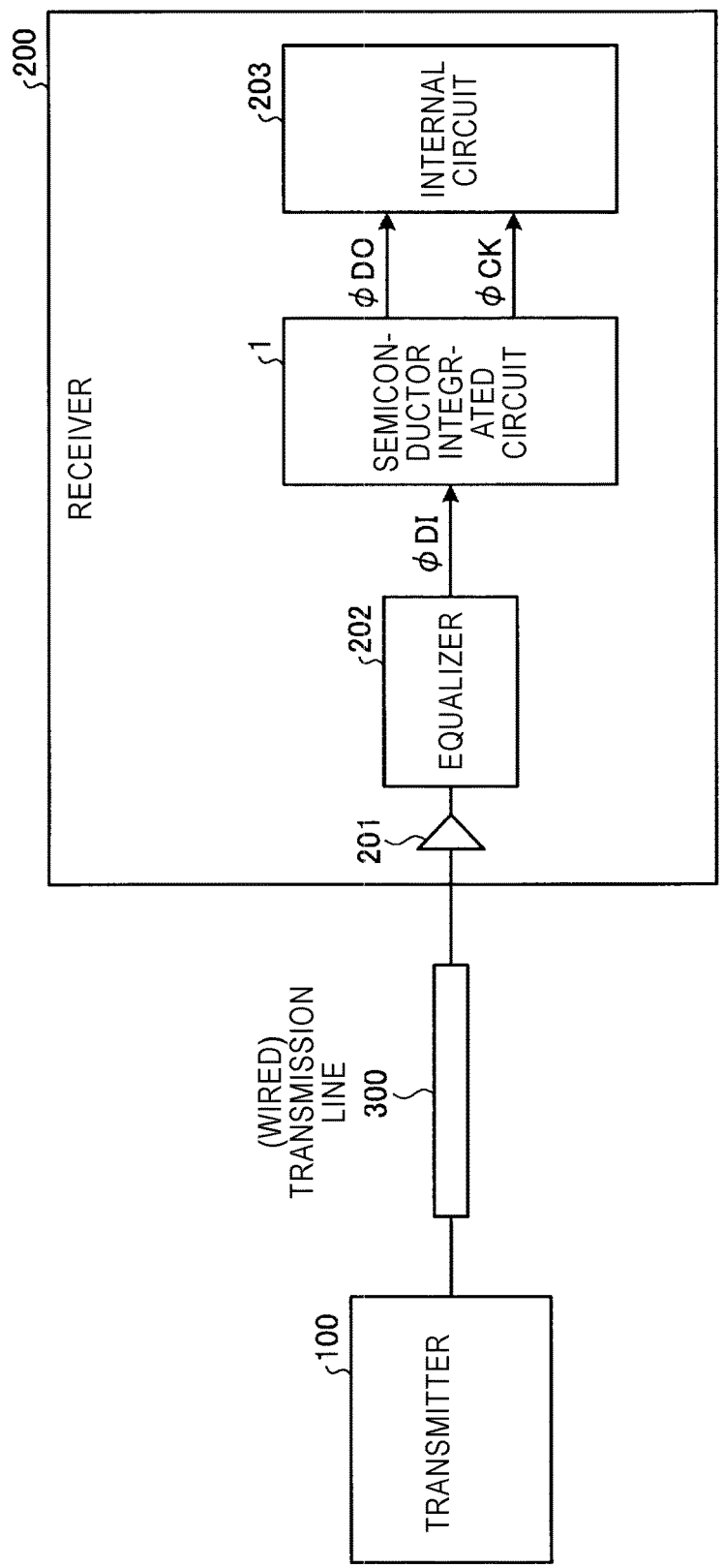
FIG. 11 is a block diagram illustrating a configuration of a receiver including a semiconductor integrated circuit according to one or more embodiments.

The CDR circuit 1 according to one or more embodiments described herein can be implemented with a receiver 200 as illustrated in FIG. 11, which is a block diagram illustrating one or more embodiments of the receiver 200. A transmitter 100 and the receiver 200 are communicably connected via a transmission line 300 (e.g. a wired transmission line). The transmitter 100 transmits a multi-level pulse-amplitude modulated signal (e.g. obtained by subjecting data to multi-level amplitude modulation) to the receiver 200 via the wired transmission line 300. The receiver 200 includes a receiver 201, an equalizer 202, a CDR circuit 1, and an internal circuit 203. The receiver 201 receives the multi-level pulse-amplitude modulated signal from the transmitter 100 via the wired transmission line 300 and supplies it to the equalizer 202. The equalizer 202 equalizes the multi-level pulse-amplitude modulated signal to generate a multi-level pulse-amplitude modulated signal ϕDI that may be processed by the CDR circuit 1. Upon receiving the multi-level pulse-amplitude modulated signal ϕDI, the CDR circuit 1 recovers a clock signal ϕCK from the multi-level pulse-amplitude modulated signal ϕDI and recovers data ϕDI by using the recovered clock signal ϕCK. The CDR circuit 1 outputs the clock signal ϕCK and the data ϕDI to the internal circuit 203. The internal circuit 203 may use the clock signal ϕCK and the data ϕDO to perform a predetermined operation.

As used herein, the singular terms "a," "an," and "the" may include plural referents unless the context clearly dictates otherwise. A time being "in the vicinity of" a reference time or "substantially" at a reference time may indicate a time within 1 millisecond of the reference time, within 5 milliseconds of the reference time, within 10 milliseconds of the reference time, within 20 milliseconds of the reference time, within 100 milliseconds of the reference time.

While certain embodiments have been described herein, these embodiments have been presented by way of example only, and are not intended to limit the scope of the present disclosure. Indeed, the embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor integrated circuit comprising:
a clock recovery circuit configured to receive a multi-level pulse-amplitude modulated signal and to recover a clock signal, the clock recovery circuit comprising:
a generation circuit comprising:
a plurality of comparators and pulse generators configured to compare the multi-level pulse-amplitude modulated signal with a plurality of threshold values to generate a plurality of pulses based on a plurality of comparison results; and
a pulse summing circuit configured to generate a synthetic pulse based on the generated plurality of pulses; and
an oscillator configured to oscillate in synchronization with the synthetic pulse to generate the clock signal.

2. The semiconductor integrated circuit according to claim 1, wherein the plurality of comparators and pulse generators comprises:
a first comparator and pulse generator configured to generate a first pulse by comparing a level of the multi-level pulse-amplitude modulated signal with a first threshold level;
a second comparator and pulse generator configured to generate a second pulse by comparing the level of the multi-level pulse-amplitude modulated signal with a second threshold level; and
a third comparator and pulse generator configured to generate a third pulse by comparing the level of the multi-level pulse-amplitude modulated signal with a third threshold level, and wherein
the pulse summing circuit is configured to generate the synthetic pulse as a function of the first pulse, the second pulse, and the third pulse.

3. The semiconductor integrated circuit according to claim 2, wherein the multi-level pulse-amplitude modulated signal can be at one of a plurality of signal levels comprising at least a first signal level and a second signal level, and wherein:
the first comparator and pulse generator comprises:
a first comparator configured to compare the level of the multi-level pulse-amplitude modulated signal with the first threshold level, the first threshold level being between the first signal level and the second threshold level, to generate a first comparison result; and
a first pulse generator configured to generate the first pulse based on the first comparison result;
the second comparator and pulse generator comprises:
a second comparator configured to compare the level of the multi-level pulse-amplitude modulated signal with the second threshold level, the second threshold level being between the first signal level and the second signal level, to generate a second comparison result; and a second pulse generator configured to generate the second pulse based on the second comparison result; and the third comparator and pulse generator comprises:

a third comparator configured to compare the level of the multi-level pulse-amplitude modulated signal with the third threshold level, the third threshold level being between the second threshold level and the second signal level, to generate a third comparison result; and a third pulse generator configured to generate the third pulse based on the third comparison result.

4. The semiconductor integrated circuit according to claim 3, wherein the plurality of signal levels further comprises a third signal level between the first signal level and the second signal level, and a fourth signal level between the second signal level and the third signal level, wherein:

the first threshold level is between the first signal level and the third signal level, the second threshold level is between the third signal level and the fourth signal level, and the third threshold level is between the fourth signal level and the second signal level.

5. The semiconductor integrated circuit according to claim 4, further comprising a data recovery circuit configured to recover data in synchronization with the clock signal recovered by the clock recovery circuit.

6. The semiconductor integrated circuit according to claim 3, further comprising a data recovery circuit configured to recover data in synchronization with the clock signal recovered by the clock recovery circuit.

7. The semiconductor integrated circuit according to claim 2, further comprising a data recovery circuit configured to recover data in synchronization with the clock signal recovered by the clock recovery circuit.

8. The semiconductor integrated circuit according to claim 1, further comprising a data recovery circuit configured to recover data in synchronization with the clock signal recovered by the clock recovery circuit.

9. The semiconductor integrated circuit according to claim 1, wherein the oscillator is an injection-locked oscillator.

10. A receiver device comprising:

an equalizer circuit configured to equalize a multi-level pulse-amplitude modulated signal that is received from outside of the receiver device; and a clock recovery circuit configured to receive the equalized multi-level pulse-amplitude modulated signal and to recover a clock signal, the clock recovery circuit comprising:

a generation circuit comprising:

a plurality of comparators and pulse generators configured to compare the multi-level pulse-amplitude modulated signal with a plurality of threshold values to generate a plurality of pulses based on a plurality of comparison results; and a pulse summing circuit configured to generate a synthetic pulse based on the generated plurality of pulses; and an oscillator configured to oscillate in synchronization with the synthetic pulse to generate the clock signal.

11. The receiver device according to claim 10, wherein the plurality of comparators and pulse generators comprises:

a first comparator and pulse generator configured to generate a first pulse by comparing a level of the multi-level pulse-amplitude modulated signal with a first threshold level;

a second comparator and pulse generator configured to generate a second pulse by comparing the level of the multi-level pulse-amplitude modulated signal with a second threshold level; and a third comparator and pulse generator configured to generate a third pulse by comparing the level of the multi-level pulse-amplitude modulated signal with a third threshold level, and wherein the pulse summing circuit is configured to generate the synthetic pulse as a function of the first pulse, the second pulse, and the third pulse.

12. The receiver device according to claim 11, wherein the multi-level pulse-amplitude modulated signal can be at one of a plurality of signal levels comprising at least a first signal level and a second signal level, and wherein:

the first comparator and pulse generator comprises:

a first comparator configured to compare the level of the multi-level pulse-amplitude modulated signal with the first threshold level, the first threshold level being between the first signal level and the second threshold level, to generate a first comparison result; and a first pulse generator configured to generate the first pulse based on the first comparison result;

the second comparator and pulse generator comprises:

a second comparator configured to compare the level of the multi-level pulse-amplitude modulated signal with the second threshold level, the second threshold level being between the first signal level and the second signal level, to generate a second comparison result; and a second pulse generator configured to generate the second pulse based on the second comparison result; and the third comparator and pulse generator comprises:

a third comparator configured to compare the level of the multi-level pulse-amplitude modulated signal with the third threshold level, the third threshold level being between the second threshold level and the second signal level, to generate a third comparison result; and a third pulse generator configured to generate the third pulse based on the third comparison result.

13. The receiver device according to claim 12, wherein the plurality of signal levels further comprises a third signal level between the first signal level and the second signal level, and a fourth signal level between the second signal level and the third signal level, wherein:

the first threshold level is between the first signal level and the third signal level, the second threshold level is between the third signal level and the fourth signal level, and the third threshold level is between the fourth signal level and the second signal level.

14. The receiver device according to claim 13, further comprising a data recovery circuit configured to recover data in synchronization with the clock signal recovered by the clock recovery circuit.

15. The receiver device according to claim 12, further comprising a data recovery circuit configured to recover data in synchronization with the clock signal recovered by the clock recovery circuit.

16. The receiver device according to claim 11, further comprising a data recovery circuit configured to recover data in synchronization with the clock signal recovered by the clock recovery circuit.

17. The receiver device according to claim 10, further comprising a data recovery circuit configured to recover data in synchronization with the clock signal recovered by the clock recovery circuit.

18. The receiver device according to claim 10, wherein the oscillator is an injection-locked oscillator.

19. A method of recovering a clock signal, comprising:
   receiving, by a clock recovery circuit, a multi-level pulse-amplitude modulated signal;
   comparing, by a plurality of comparators and pulse generators, the multi-level pulse-amplitude modulated signal with a plurality of threshold values to generate a plurality of pulses based on a plurality of comparison results;
   generating, by a pulse summing circuit, a synthetic pulse based on the generated plurality of pulses; and
   oscillating, by an oscillator, in synchronization with the synthetic pulse to generate the clock signal.

20. The method of claim 19, wherein the plurality of comparators and pulse generators comprises at least a first comparator and pulse generator, a second comparator and pulse generator, and a third comparator and pulse generator, the method further comprising:
   generating, by the first comparator and pulse generator, a first pulse by comparing a level of the multi-level pulse-amplitude modulated signal with a first threshold level;
   generating, by the second comparator and pulse generator, a second pulse by comparing a level of the multi-level pulse-amplitude modulated signal with a second threshold level;
   generating, by the third comparator and pulse generator, a third pulse by comparing a level of the multi-level pulse-amplitude modulated signal with a third threshold level; and
   generating, by the pulse summing circuit, the synthetic pulse as a function of the first pulse, the second pulse, and the third pulse.

* * * * *